United States Patent [19]
Ema et al.

[11] Patent Number: 5,138,623
[45] Date of Patent: Aug. 11, 1992

[54] SEMICONDUCTOR LASER CONTROL DEVICE

[75] Inventors: Hidetoshi Ema, Yokohama; Masaaki Ishida, Machida, both of Japan

[73] Assignee: Ricoh Company, Ltd., Tokyo, Japan

[21] Appl. No.: 663,158

[22] Filed: Mar. 1, 1991

[30] Foreign Application Priority Data

Mar. 6, 1990 [JP] Japan .................................. 2-54326
Mar. 19, 1990 [JP] Japan .................................. 2-69188

[51] Int. Cl.⁵ ............................................. H01S 3/10
[52] U.S. Cl. ................................................... 372/38
[58] Field of Search ................................. 372/38, 29

[56] References Cited
U.S. PATENT DOCUMENTS

4,985,896 1/1991 Kimizuka et al. .................... 372/38

*Primary Examiner*—James W. Davie
*Attorney, Agent, or Firm*—Oblon, Spivak, McClelland, Maier & Neustadt

[57] ABSTRACT

A semiconductor laser control device that comprises a light receiving photodiode for detecting light emitted from a semiconductor laser element to be controlled and a current amplifier circuit. To the amplifier circuit, the light receiving photodiode and a light emitting command signal are connected so as to apply first forward current to the laser element in response to difference between the light detection signal and an input signal corresponding to the light emitting command signal so that a negative feed back circuit is constituted from the light receiving photodiode and the amplifier circuit. The device further comprises a current applying circuit for applying second forward current to the laser element in conjunction with said first forward current and a correction circuit for correcting the second forward current.

17 Claims, 4 Drawing Sheets

SEMICONDUCTOR LASER CONTROL DEVICE

BACKGROUND OF THE INVENTION

1. Field of the Invention

The present invention relates to a semiconductor laser control device that controls the optical output of a semiconductor laser device used as a light source of a photoelectronic system such as a laser printer, an optical disk device or an optical communication system.

2. Description of the Related Art

The semiconductor laser device has been widely used lately in various technical fields as a light source of an optical disk device and a laser printer etc. However, the optical output characteristic of the semiconductor laser device is strongly influenced by the ambient temperature. To cope with this, various types of APC (Automatic Power Control) circuits have been proposed in order to obtain a desirable optical output from the laser device. There are three essential types of the APC circuit.

The first type of the APC circuit is arranged in such a way that the optical output from the semiconductor laser device is monitored by a light receiving element and that a photoelectric negative feed back loop is formed to control the forward current of the semiconductor laser to equalize the detection output of the light receiving element to the light emitting level of the command signal so that the optical output from the laser device is controlled to be a desirable value.

The second type of the APC circuit is arranged in such a way that, in a power setting period, the optical output from the semiconductor laser device is monitored by a light receiving element so as to control the forward current of the laser so that the detection output of the light receiving element becomes equal to the level of the light emitting command signal and that, in a period other than the power setting period, the laser device is controlled so that the forward current of the laser is modulated by information to maintain a set value.

The third type of the APC circuit is arranged in such a way that the temperature of the laser device is measured so as to control the forward current of the laser in response to the measured temperature or to maintain the temperature constant so that a desired optical output can be obtained from the semiconductor laser device.

Further, there is a fourth type of the APC circuit which is superior to the three types of the control circuits mentioned above. The fourth type control circuit is arranged in such a way that the optical output from the semiconductor laser device is monitored by a light receiving element, that a photoelectric negative feed back loop is formed to control the forward current of the laser so that the detection output of the light receiving element becomes equal to the level of the light emitting command signal and that a current converter is provided for converting the light emitting command signal to the forward current of the semiconductor laser so that the laser device is controlled in response to the sum of or difference between the current generated from the converter and the control current for the negative feed back loop.

However, in accordance with the fourth type of control circuit, when the differential quantum efficiency is changed, the cross frequency of the photoelectric negative feed back loop is also changed in the open loop state thereof. As a result, the control speed of the feed back loop becomes different from the preset value, which lowers the control speed and accuracy of the semiconductor laser output and impairs the resolution of the laser and which makes the laser device easy to be influenced by disturbance.

SUMMARY OF THE INVENTION

It is therefore an object of the present invention to provide a semiconductor laser control device wherein the above mentioned drawbacks are obviated so that the laser output can be controlled accurately at a high speed and in high resolution minimizing being influenced from disturbance.

The above mentioned object of the present invention can be achieved by a semiconductor laser control device comprising:

a light receiving element for detecting light emitted from a semiconductor laser element to be controlled, the light receiving element outputting a light detection signal;

a current amplifier circuit to which the light receiving element and a light emitting command signal are connected so as to apply first forward current to the laser element in response to difference between the light detection signal and an input signal corresponding to the light emitting command signal so that a negative feed back circuit is constituted from the light receiving element and the amplifier circuit;

a current applying circuit for applying second forward current to the laser element in conjunction with the first forward current; and a correction circuit for correcting the second forward current.

The above mentioned object of the present invention can be also achieved by a semiconductor laser control device comprising:

a light receiving element for detecting light emitted from a semiconductor laser element to be controlled;

a first negative feed back loop for controlling forward current applied to the laser element, the loop being constituted from said laser element, said light receiving element, a transistor having an emitter connected to the light receiving element through a resistance, and an amplifier circuit for amplifying difference current between collector current of the transistor and a light emitting command signal current; and a second negative feed back loop constituted from the laser element, the light receiving element, a voltage detector for detecting voltage between both ends of the resistance, a comparator which compares the voltage and a light emitting command signal voltage and outputs an error signal in response to the comparison result, a voltage-current converter for converting the error signal to light emitting command current, and an amplifier circuit for amplifying the command current.

An advantage of the above mentioned structure of the semiconductor laser control device is that it becomes possible to accurately control the semiconductor laser at a high speed and in high resolution, which raises the reliability of laser control.

Further objects and advantages of the present invention will be apparent from the following description of the preferred embodiments of the invention as illustrated in the accompanying drawings.

DESCRIPTION OF THE PREFERRED EMBODIMENTS

Figure 1:
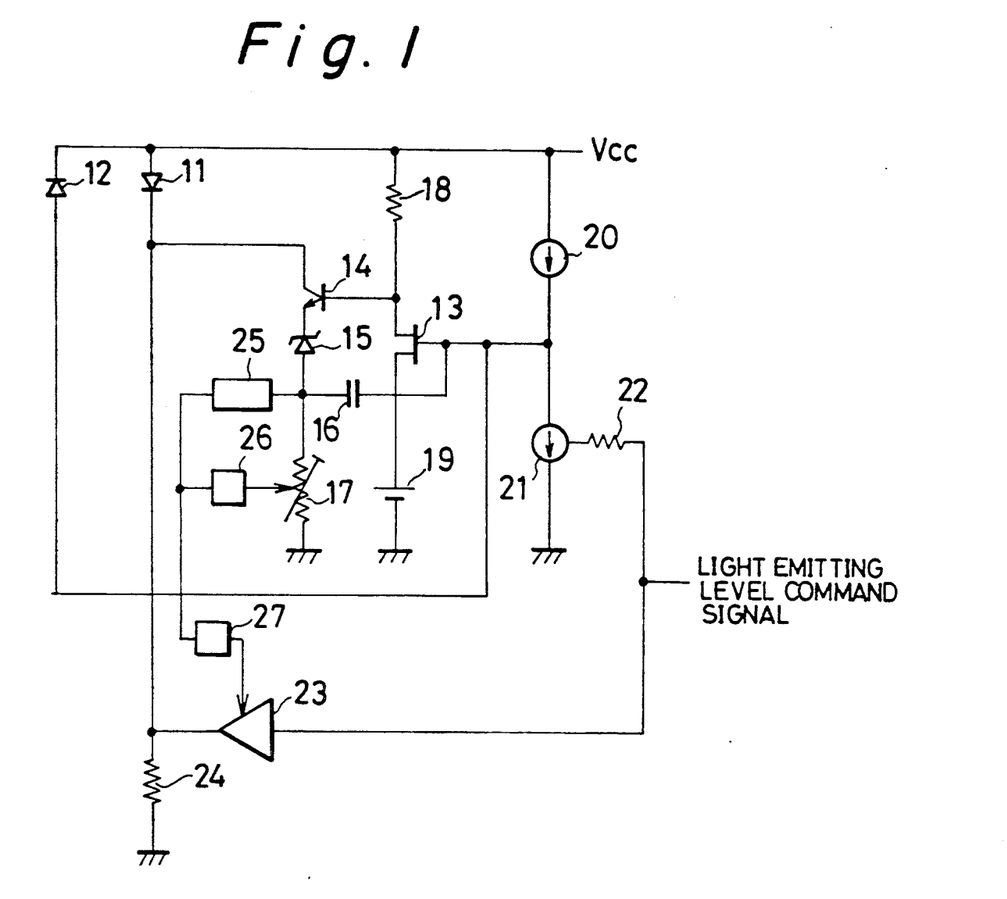
FIG. 1 is a circuit diagram of the semiconductor laser control device in accordance with an embodiment of the present invention.

FIG. 1 illustrates an embodiment of the present invention.

In FIG. 1, numeral 11 designates a semiconductor laser element composed of a laser diode to be controlled and numeral 12 designates a light receiving element. The circuit further comprises a field effect transistor 13, a bipolar transistor 14, a voltage regulation diode 15, a capacitor 16, a variable resistance 17, a resistance 18, and a direct current power source 19. The components 13 to 19 constitute a first current amplifier in which the source of the transistor (FET) 13 is connected to the power source 19 and the drain thereof is connected to another power source Vcc through the resistance 18.

With regard to the transistor 14, the base is connected to the drain of the transistor 13 and the collector is connected to the cathode of the laser element 11. The emitter of the transistor 14 is grounded through the diode 15 and the resistance 17 in series. Also, the connecting point between the diode 15 and the resistance 17 is connected to the drain of the FET 13 through the capacitor 16.

It is to be noted that the bipolar transistor 14 may be replaced by an FET. In this case, the drain, gate and source of the FET are arranged to correspond to the collector, base and emitter of the bipolar transistor 14, respectively, and connected in the same manner as the corresponding parts of the transistor 14.

A current converter is constituted from the first current amplifier mentioned above, current sources 20, 21 and a resistance 22. The current converter in conjunction with the element 12 constitutes a photoelectric negative feed back loop.

Numeral 23 designates a current converter which converts a light emitting command signal to a forward current of the laser element 11 in accordance with a predetermined conversion rule on the basis of the optical output and the forward current characteristic of the laser element 11, the coupling coefficient of the elements 11 and 12 and the optical input and the light receiving signal characteristic of the element 12 so that the light receiving signal level of the element 12 becomes equal to the level of the light emitting command signal. Numeral 24 designates a resistance. Numeral 25 designates a differentiating quantum efficiency correction circuit for the semiconductor laser. Each of numerals 26 and 27 designates a constant multiplying element. The circuit 25 detects the voltage between the both ends of the resistance 17 and changes on the basis of the detection result the value of the resistance 17 and the conversion rule of the converter 23.

The light emitting level command signal is converted to a first light emitting level command current through the resistance 22 and input to the current source 21 to change the current value thereof.

On the other hand, the element 12 detects a part of the optical output from the laser element 11. To the first current amplifier constituted from the components 13 to 19 is input current corresponding to the difference between the above mentioned first light emitting level command current and the light receiving current in proportion to the laser output detected by the element 12. The amplifier transmits the current input thereto to the laser element 11 as the forward current so as to control the forward current of the element 11 so that the first light emitting level command current is equalized to the light receiving current.

Also, the light emitting level command signal is converted by the converter 23 to a second light emitting level command current on the basis of the optical output and the forward current characteristic of the laser element 11, the coupling coefficient of the elements 11 and 12, and the optical input and the light receiving characteristic of the element 12 so that the light receiving signal from the element 12 becomes equal to the light emitting level command signal in accordance with the predetermined conversion rule. The second light emitting level command current is transmitted to the laser element 11 as the forward current thereof.

The laser element 11 is controlled by the current corresponding to the sum of or difference between the control current of the photoelectric negative feed back loop (12 to 22) and the current generated from the converter 23 so that the optical output of the laser element 11 is controlled to correspond to the light emitting level command signal.

It is to be noted that, on the assumption that the optical amount (PS) determined by the converter 23 is equal to the optical output (PL) when the time $t = \infty$, the optical output from the laser element 11 becomes equal to PL instantaneously. In this case, the control current output from the feed back loop (12 to 22) to the element 11 is being unchanged.

On the other hand, in the event that the optical output and the forward current characteristic of the laser element 11 are changed due to temperature change or disturbance resulting in change of PS, the current having surplus or deficit obtained by the converter 23 is transmitted to the laser element 11 in the forward direction thereof as the control current output from the loop (12 to 22). In this case, the change of the control current means the change of the collector current which is nearly equal to the emitter current. The collector current mostly runs through the resistance 17. Therefore, it becomes possible to detect the change of current by measuring the voltage between the both ends of the resistance 17 with the light emitting level command signal being changed for a predetermined period.

Taking the above mentioned points into consideration, the correction circuit 25 detects the voltage between the both ends of the resistance 17 and inputs the detection signal to the converter 23 through the element 27 so as to control the conversion rule of the converter 23 so that the absolute value of the change becomes minimum in the above mentioned predetermined period, while the conversion rule is maintained unchanged for the other period.

Further, the change of the optical output and the characteristic of the laser element 11 also influences the frequency characteristic of the negative feed back loop (12 to 22). The open loop gain A of the feed back loop is theoretically represented in an approximate formula as $$A = \frac{\alpha S \eta}{j\omega C_{16} R_{17}}$$

wherein, $C_{16}$: capacity of capacitor 16,
$R_{17}$: resistance value of resistance 17,
$\alpha$: coupling coefficient of elements 11 and 12,
$S$: light receiving sensitivity of element 12,
$\eta$: differentiating quantum efficiency of element 11.

The cross frequency f of the loop (12 to 22) is the frequency when A=1. Therefore, the frequency f is represented as follows.

$$f = \frac{\alpha S}{2\pi} \cdot \frac{\eta}{C_{16} R_{17}}$$

That is, the frequency f which corresponds to the control speed of the loop (12 to 22) is in proportion to the efficiency $\eta$. Therefore, it becomes possible to minimize the change of control speed of the loop by controlling the value of the resistance 17 by the correction circuit 25 through the circuit 26.

It is to be noted that the control speed change of the loop may be minimized by controlling the capacity of the capacitor 16 by the output signal of the circuit 25 instead of controlling the resistance value of the resistance 17, as mentioned above.

Figure 2:
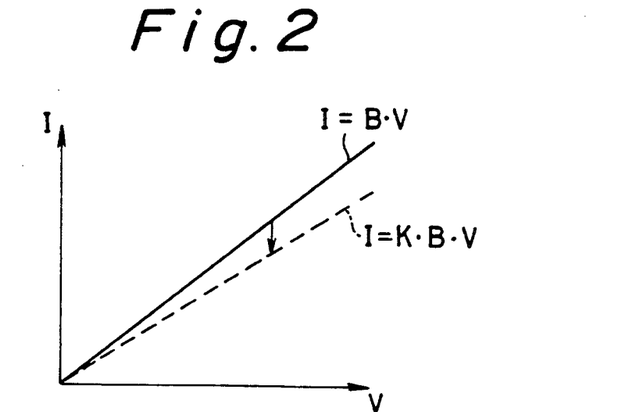
FIG. 2 is a graphical view of a characteristic of the current converter used in the circuit of the embodiment of FIG. 1.

FIG. 2 illustrates the current-voltage (I-V) characteristic of the above mentioned current converter 23.

Assuming that V represents the light emitting level command signal input to the converter 23, B represents the amplifying ratio of the converter 23, k represents the attenuation coefficient of the signal output from the circuit 25 and input to the converter 23 through the element 27, and I represents the current output from the converter 23, when the element 27 does not transmit any signals to the converter 23, the current I is represented by I=BV as illustrated in a solid line in FIG. 2, while when the converter 23 receives an input signal from the element 27, the current I is represented by I=k·BV, as illustrated in a dash line in FIG. 2.

As mentioned above, in accordance with the embodiment of the present invention, the output signal from the semiconductor laser differentiating quantum efficiency correction circuit 25 is input to the variable resistance 17 through the constant magnifying element 26 so that the cross frequency of the negative feed back loop in the open loop state thereof is corrected to be maintained constant. Also, the output signal from the circuit 25 is input to the current converter 23 through the constant magnifying element 27 so as to correct the inclination of the conversion characteristic of the converter 23 so that the absolute value of the control current of the negative feed back loop becomes minimum. Due to the arrangement mentioned above, the cross frequency of the negative feed back loop in the open loop state does not change even if the differentiating quantum efficiency of the laser element 11 is changed, which makes it possible to raise the functional speed and accuracy of the control circuit and operate the laser device in high resolution without being influenced by disturbance.

Figure 3:
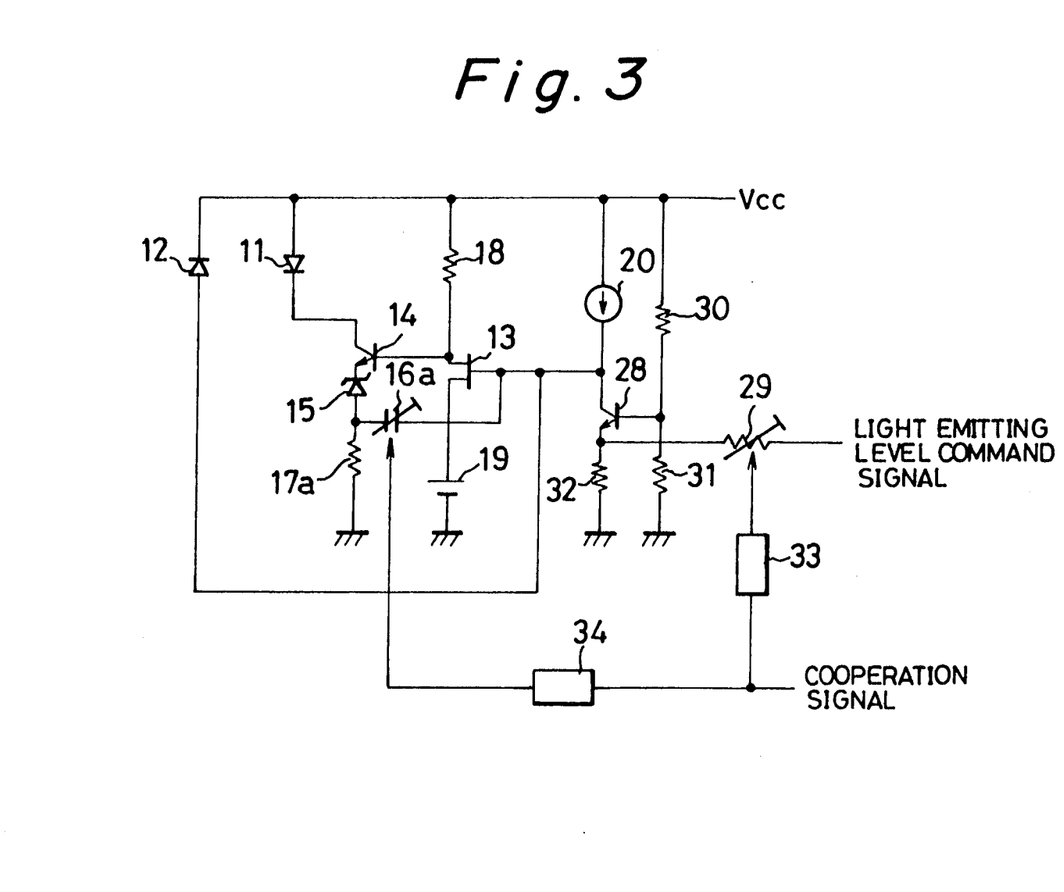
FIG. 3 is a circuit diagram of the semiconductor laser control device in accordance with another embodiment of the present invention.

FIG. 3 illustrates a circuit diagram of another embodiment of the present invention.

The circuit comprises a semiconductor laser element 11 to be controlled and constituted from a laser diode, a light receiving element 12, an FET 13, a bipolar transistor 14, a regular voltage diode 15, a variable capacitor 16a, a resistance 17a, a resistance 18, and a direct current power source 19. The components 13 to 19 constitute a current amplifier. The structure of the amplifier is substantially the same as the first amplifier of the first embodiment mentioned before except that the variable capacitor 16a is provided instead of the capacitor 16 and that the resistance 17a is provided instead of the variable resistance 17.

Note that an FET may be used instead of the bipolar transistor 14, as mentioned before.

The above mentioned current amplifier constitutes a current converter in conjunction with a current source 20, a bipolar transistor 28, a variable resistance 29, and resistance 30 to 32. Further, the current converter constitutes a photoelectric negative feed back loop in conjunction with the light receiving element 12. The negative feed back loop of this embodiment substantially functions in the same manner as that of the first embodiment mentioned before.

Each of numerals 33 and 34 designates a correction circuit to which an cooperation signal is input from a not shown variable means.

In an initial setting process, the relation between the light emitting level command signal and the optical output of the semiconductor laser element 11 is adjusted. In the process, by the cooperation signal transmitted from the not shown variable means, the correction circuit 34 changes the capacity of the capacitor 16a in response to the change of the resistance value of the resistance 29 which is changed by the correction circuit 33. As a result, the cross frequency of the feed back loop is kept unchanged.

The open loop gain A of the negative feed back loop is theoretically represented by $$A = \frac{\alpha S \eta}{j\omega C_{16a} R_{17a}}$$

wherein $C_{16a}$: capacity of capacitor 16a,
$R_{17a}$: resistance value of resistance 17a. The cross frequency $f_o$ of the negative feed back loop is the frequency when A=1. Therefore, $f_o$ is represented as follows.

$$f_o = \frac{\eta}{2\pi} \cdot \frac{\alpha S}{C_{16a} R_{17a}}$$

The initial setting is to arrange the optical output $P_o$ of the laser element 11 in relation to the voltage $V_o$ of the light emitting level command signal wherein the light emitting level command current is equal to the detection current of the light receiving element 12. Therefore, the following equation is satisfied in which $R_1$ represents the resistance value of the variable resistance 29.

$$V_o/R_1 = \alpha S P_o$$

Therefore, the frequency $f_o$ is represented by $$f_o = \frac{\eta}{2\pi} \cdot \frac{1}{C_{16a}R_{17a}} \cdot \frac{V_o}{P_o R_1}$$

which can be rewritten as follows.

$$C_{16a}R_1 = \frac{\eta}{2\pi f_o} \cdot \frac{V_o}{P_o} \cdot \frac{1}{R_{17a}} \quad (1)$$
$$= \text{const.}$$

That is, by arranging the circuits 33 and 34 to cooperate with each other to adjust $C_{16a}$ and $R_1$ to set $C_{16a}R_1$ as being constant ($C_{16a}R_1 =$ const.), it becomes possible to maintain the control speed of the feed back loop being constant.

It is to be noted that, in the above mentioned embodiment, the resistance value of the resistance 17a is maintained constant while the capacity $C_{16a}$ of the capacitor 16a is arranged variable. However, it is possible to arrange in such a manner that the capacity $C_{16a}$ of the capacitor 16a is constant while the resistance value of the resistance 17a is varied by the correction circuit 34. The correction circuits 33 and 34 are arranged to satisfy the equation (1).

Also, in the above mentioned embodiment, the variable resistance 29 is used as the means for converting the light emitting level command signal to the light emitting level command current. However, instead of the resistance 29, another means which can change the conversion efficiency of the converting means may be adopted.

In accordance with the embodiment mentioned above, the correction circuits 33 and 34 is arranged to cooperate with each other to adjust and set $C_{16a}$ and $R_1$ so that the conversion efficiency of the converting means is changed in relation to the change of the frequency characteristic of the current amplifier. Therefore, by determining the relation between the optical output of the laser element and the input of the laser control device, the control speed of the negative feed back loop is automatically adjusted, which means that the speed can be easily controlled irrespective of the characteristic unevenness of the laser element 11 and the light receiving element 12, resulting in that the cost is reduced and the laser can be controlled accurately at a high speed in high resolution without being influenced by disturbance.

The present inventin is further described in detail in comparison to the related art which is also described with reference to the drawings.

In general, it is required that the semiconductor laser control circuit be arranged in such a way that the optical output of the semiconductor laser source is controlled at a high speed to be maintained at a predetermined level and that the laser output is stable irrespective of disturbance such as temperature change or optical amount change due to the backward light.

Figure 4:
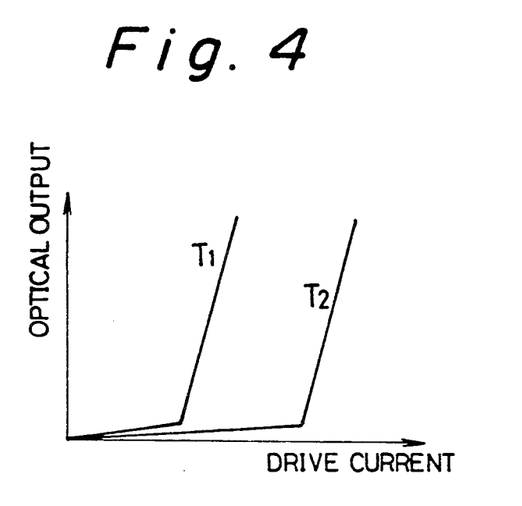
FIG. 4 is a graphical view of a temperature characteristic of the semiconductor laser.

FIG. 4 illustrates the characteristic of semiconductor laser representing the optical output in relation to the drive current (forward current) wherein lines $T_1$ and $T_2$ represent the characteristic at different temperatures $T_1$ and $T_2$, respectively. As can be seen from the graph, the starting current which triggers to generate the laser differs greatly according to temperature.

Taking the above mentioned characteristic into consideration, a semiconductor laser control circuit is arranged in such a way that a part of the optical output from the semiconductor laser element is monitored by a light receiving element and that a photoelectric negative feed back loop is formed to control the starting current so that the current is maintained being equal to the light emitting command signal current.

Figure 5:
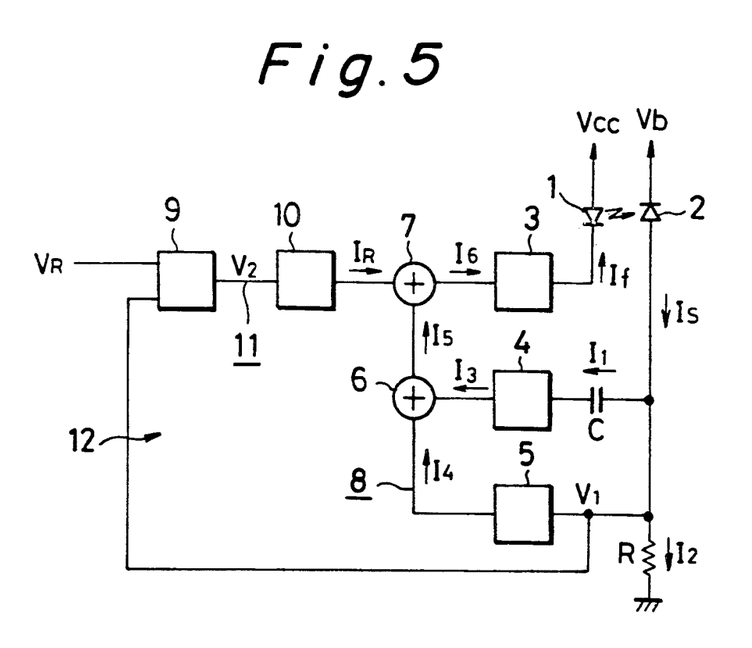
FIG. 5 is a block diagram of the semiconductor laser control device in accordance with the related art.

FIG. 5 illustrates a circuit diagram for controlling a semiconductor laser element 101 which is applied to an optical pickup device.

The laser element 101 is connected to a voltage power source Vcc. A light receiving element composed of a photodiode 102 for example is arranged to receive a part of the laser emitted from the laser element 101 to monitor the optical intensity of the laser. The photodiode 102 is connected to a couterbias voltage Vb. To the laser element 101 is connected a wide band current amplifier 103 which includes the direct current If for driving the element 101. Also, a detection resistance R is connected between the photodiode 102 and the ground.

Further, between the photodiode 102 and the ground is connected an impedance converter 104 to the photodiode 102 through a capacitor C. Through the converter 104 flows shunt current $I_1$ of the light generating current Is which is in proportion to the optical intensity of the laser from the element 101 detected by the element 102. The converter 104 is arranged in such a way that the input impedance is low while the output impedance is high.

Further, a first voltage-current converter 105 is connected to the photodiode 102 in parallel to the converter 104. To the converter 105 is input voltage $V_1$ which corresponds to current $I_2$ running through resistance R and corresponding to current of the light generating current Is with the shunt current $I_1$ being subtracted therefrom.

The output current $I_3$ from the converter 104 and the output current $I_4$ from the converter 105 are input to an adder 106. The sum current $I_5$ output from the adder 106 is input to a current adder 107 along with the reference current $I_R$. The sum current $I_6$ output from the adder 107 is input to the amplifier 103 and output therefrom to the laser element 101 as the light emitting level command signal current. That is, the converters 104 and 105 are arranged to constitute a feed back circuit from the photodiode 102 to the amplifier 103 connected to the laser element 101 so as to form a wide band photoelectric negative feed back loop 108.

Also, a difference amplifier 109 is arranged to which is input reference voltage $V_R$ and voltage $V_1$ corresponding to the current $I_2$ running through the resistance R. The output voltage $V_2$ from the amplifier 109 is input to a second voltage-current converter 110. The converter 110 outputs the reference current $I_R$ to the adder 107. That is, the amplifier 109 and the converter 110 is arranged to constitute a feed back circuit through the adder 107 from the photodiode 102 to the amplifier 103 connected to the laser element 101 so as to form a low frequency band photoelectric negative feed back loop 111.

The feed back loops 108 and 111 constitute a high speed semiconductor laser drive circuit 112.

In accordance with the above mentioned structure, the current $I_6$ input to the amplifier 103 which outputs the drive current If to the laser element 101 is represented as $I_6 = I_R - I_5$ wherein $I_R$ is the reference current in proportion to the voltage $V_2$ input to the second converter 110 and $I_5$ is the current output from the adder 106. The current $I_3$ which is one component of the current $I_5$ is arranged to be equal to the current $I_1$ by the converter 104. Also, the current $I_4$ which is another component of the current $I_5$ is arrenged to be equal to the current $I_2$ running through the resistance R by the converter 105.

Due to the arrangement mentioned above, the current $I_5$ which is input to the adder 107 becomes equal to the sum of $I_1$ and $I_2$, that is, the light generating current Is monitored by the photodiode 102.

In other words, the circuit functions in such a way that, at the time of reading operation, the light receiving element 102 detects the optical intensity of the laser emitted from the laser element 101 and that the detected signal which is equal to the light generating current Is is fed back to the amplifier 103 as the current $I_6$ from the adder 107 at a speed faster than the minimum pulse width of the reading data, by the feed back loop 108 constituted from the converters 104 and 105, so as to control the laser element 101 so that the optical intensity of the laser emitted therefrom becomes stable enough to be used for reading information.

Also, the low frequency component is fed back to the amplifier 103 as the current $I_6$ from the adder 107 at a speed faster than the minimum pulse width of the reading data, by the feed back loop 111 constituted from the amplifier 109 and the converter 110, so as to control the laser element 101 so that the optical intensity of the laser emitted therefrom becomes stable enough to be used for reading information.

As mentioned above, due to the arrangement of the feed back loops 108 and 111, it becomes possible to achieve stable feed back control of laser at a speed faster than the minimum pulse width of the reading data.

However, in accordance with the control circuit of FIG. 5, the light generating current Is is detected by dividing the current to the low frequency band and the high frequency (wide) band, which makes it necessary to set gains for the low and high frequency bands by adjusting the conversion ratio of the converter 105 and the resistance R.

The embodiment of the invention described below is improved from the laser control device structure mentioned above.

Figure 6:
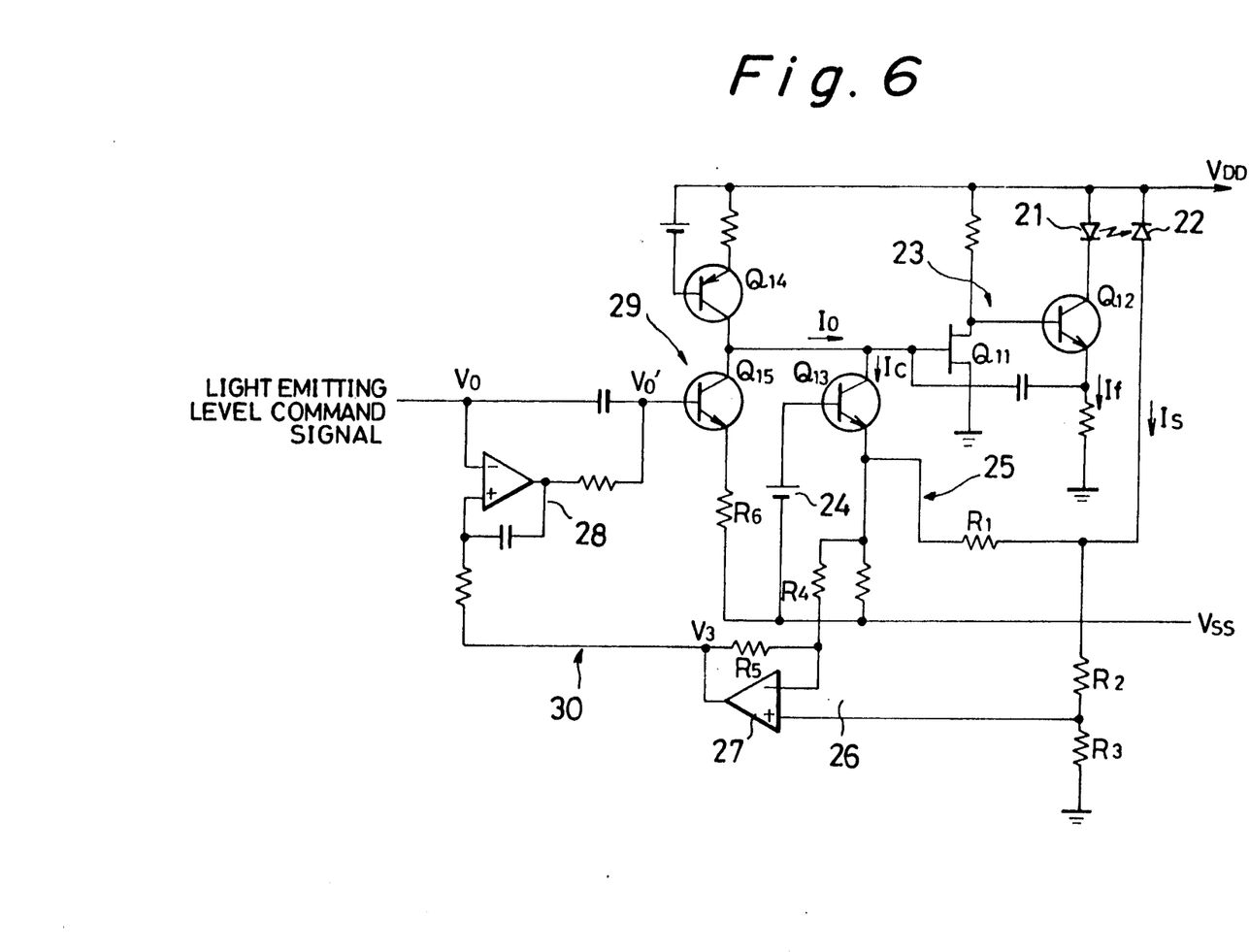
FIG. 6 is a circuit diagram of the semiconductor laser control device in accordance with still another embodiment of the present invention.

FIG. 6 illustrates a circuit diagram in accordance with an embodiment of the present invention.

Numeral 121 designates a semiconductor laser element to be controlled and numeral 122 designates a light receiving element such as a photodiode which monitors a part of the laser emitted from the laser element 121. The elements 121 and 122 are arranged to form a pair of diodes.

The laser element 121 emits the laser when forward current If runs therethrough. The current If is transmitted from a current amplifier 123 constituted from transistors $Q_{11}$ and $Q_{12}$ to which amplifier is input a light emitting level command signal current.

The photodiode 122 generates light generating current Is in proportion to the optical output of the laser element 121. The current Is shunts through resistance $R_1$ and resistances $R_2$ and $R_3$ which are connected to the photodiode 122.

The resistances are arranged as $R_1 < (R_2 + R_3)$. Therefore, the current Is mostly runs through the resistance $R_1$ which is connected to the emitter of the transistor $Q_{13}$. The base of the transistor $Q_{13}$ is connected to a base bias power source 24. The collector of the transistor $Q_{13}$ is connected to the input side of the above mentioned amplifier 123. Therefore, current $I_0$ (command signal) minus Ic (collector current of the transistor $Q_{13}$) is input to the amplifier 123.

The laser element 121, the photodiode 122, the resistance $R_1$, the transistor $Q_{13}$ and the amplifier 123 constitute a first photoelectric negative feed back loop 125. That is, the current Is is converted to the collector current Ic of the transistor $Q_{13}$ which current Ic is subtracted from the command signal current $I_0$ so that the forward current If of the laser element 121 is controlled in response to the difference current.

On the other hand, a voltage detector 126 is arranged to detect the voltage between both ends of the resistance $R_1$. The detector 126 is constituted as a differential amplifier composed of the resistances $R_2$, $R_3$, $R_4$, and $R_5$ and an OP amplifier 127 to which the divided voltage from the resistances are input. The output voltage $V_3$ from the detector 126 is input to a comparator 128 comprising an OP amplifier. The command signal voltage $V_0$ is also input to the comparator 128 so that the comparator 128 amplifies and outputs the differential voltage between $V_0$ and $V_3$ as an error voltage $V_0'$. The voltage $V_0'$ output from the comparator 128 is input to a voltage-current converter 129. The converter 129 comprises transistors $Q_{14}$ and $Q_{15}$ connected in series and a resistance $R_6$ connected to the emitter of the transistor $Q_{15}$.

In accordance with the above mentioned arrangement, the error voltage $V_0'$ which is input to the base of the transistor $Q_{15}$ is converted to a current value as $V_1/R_6$ by the resistance $R_6$. The converted current is input to the amplifier 123 as the command signal current $I_0$.

The laser element 121, the photodiode 122, the voltage detector 126, the comparator 128, the converter 129 and the amplifier 123 constitute a second photoelectric negative feed back loop 130. Due to the arrangement of the loop, the forward current of the laser element 121 is controlled so that the optical output from the laser element 121 is equalized to the light emitting command signal.

Many widely different embodiments of the present invention may be constituted without departing from the spirit and scope of the present invention. It should be understood that the present invention is not limited to the specific embodiments described in the specification, except as defined in the appended claims.

What is claimed is:

1. A semiconductor laser control device comprising:
   a light receiving means for detecting light emitted from a semiconductor laser element to be controlled, including means for outputting a light detection signal;
   a current amplifier circuit to which said light receiving means and a signal line for a light emitting command signal are connected so as to apply a first forward current to said laser element in response to a difference between said light detection signal and an input signal corresponding to said light emitting command signal so that a negative feed back loop is constituted from said light receiving means and said amplifier circuit;
   a current applying means for applying a second forward current to said laser element in conjunction with said first forward current, having means for converting said light emitting command signal to said second forward current in accordance with a predetermined conversion rule; and a correction means for modifying said conversion rule according to said first forward current in such a manner that an absolute value of said first current is minimized.

2. A semiconductor laser control device according to claim 1, further comprising means for maintaining a constant cross frequency of said negative feed back loop in an open state thereof according to said first forward current.

3. A semiconductor laser control device according to claim 1, further comprising means for detecting said first forward current.

4. A semiconductor laser control device according to claim 1, wherein said light receiving means comprises a photodiode.

5. A semiconductor laser control device according to claim 2, wherein said current amplifier circuit includes an FET having a drain connected to said light receiving means, and a bipolar transistor having a base connected to said drain of said FET, a collector connected to said laser element and an emitter connected to the ground.

6. A semiconductor laser control device according to claim 5, wherein said emitter of said bipolar transistor is connected to the ground through a resistance and to a gate of said FET through a capacitor.

7. A semiconductor laser control device according to claim 6, wherein said resistance is variable.

8. A semiconductor laser control device according to claim 7, said maintaining means includes means for changing said variable resistance.

9. A semiconductor laser control device according to claim 6, wherein said capacitor is variable.

10. A semiconductor laser control device according to claim 9, wherein said maintaining means includes means for changing said variable capacitor.

11. A semiconductor laser control device according to claim 2, wherein said current amplifier circuit includes a first FET having a drain connected to said light receiving means, and a second FET having a gate connected to said drain of said first FET, a drain connected to said laser element and a source connected to the ground.

12. A semiconductor laser control device according to claim 11, wherein said source of said second FET is connected to the ground through a resistance and to a gate of said first FET through a capacitor.

13. A semiconductor laser control device according to claim 12, wherein said resistance is variable.

14. A semiconductor laser control device according to claim 13, wherein said maintaining means includes means for changing said variable resistance.

15. A semiconductor laser control device according to claim 12, wherein said capacitor is variable.

16. A semiconductor laser control device according to claim 15, wherein said maintaining means includes means for changing said variable capacitor.

17. A semiconductor laser control device according to claim 1, wherein said conversion rule is a linear conversion and said correction means has a modifying means for changing an inclination of a characteristic of said correction means.

* * * * *